US011993403B2

United States Patent
Blumer et al.

(10) Patent No.: US 11,993,403 B2
(45) Date of Patent: May 28, 2024

(54) ADVANCED COOLING FOR CRYOGENIC POWERED VEHICLES

(71) Applicant: The Boeing Company, Chicago, IL (US)

(72) Inventors: John H. Blumer, Huntsville, AL (US); Gregory R. Day, Madison, AL (US); Marianne E. Mata, Chicago, IL (US); Martin E. Lozano, Chicago, IL (US); Tyler C. Staudinger, Chicago, IL (US); Mark W. Henley, Chicago, IL (US)

(73) Assignee: The Boeing Company, Chicago, IL (US)

( * ) Notice: Subject to any disclaimer, the term of this patent is extended or adjusted under 35 U.S.C. 154(b) by 851 days.

(21) Appl. No.: 15/988,973

(22) Filed: May 24, 2018

(65) Prior Publication Data

US 2019/0359355 A1 Nov. 28, 2019

(51) Int. Cl.
*B64G 1/42* (2006.01)
*B64G 1/40* (2006.01)
(Continued)

(52) U.S. Cl.
CPC .............. *B64G 1/42* (2013.01); *B64G 1/402* (2013.01); *B64G 1/50* (2013.01); *B64G 1/503* (2013.01); *F28C 3/00* (2013.01); *H01L 23/34* (2013.01); *H01M 8/00* (2013.01); *H01M 8/04089* (2013.01); *H01M 8/04208* (2013.01); *H01M 8/04328* (2013.01); *H01M 8/04388* (2013.01); *H01M 8/04701* (2013.01);
(Continued)

(58) Field of Classification Search
CPC . B64G 1/50; F28C 3/00; H01L 23/34; H01M 8/04208; H01M 8/04701; H01M 2250/20; H01M 8/00
See application file for complete search history.

(56) References Cited

U.S. PATENT DOCUMENTS

| | | | |
|---|---|---|---|
| 2,925,722 A * | 2/1960 | Blackburn | B64D 13/08 62/223 |
| 3,565,166 A * | 2/1971 | Huebscher | H01M 8/04156 165/300 |

(Continued)

OTHER PUBLICATIONS en.wikipedia.org/wiki/Solenoid_valve (Year: 2020).*

(Continued)

*Primary Examiner* — Larry L Furdge
(74) *Attorney, Agent, or Firm* — Haynes and Boone, LLP

(57) ABSTRACT

In one or more embodiments, a disclosed method for cooling a vehicle involves routing, by a bypass line, boil-off of a cryogenic fuel of the vehicle past a cold plate to cool a subsystem mounted proximate the cold plate. The method further involves purging the boil-off in a direction away from the vehicle, after the boil-off passes the cold plate. In one or more embodiments, the cryogenic fuel involves liquid hydrogen (LH2), liquid oxygen (LO2), and/or liquid methane (LCH4). In at least one embodiment, the boil-off of the cryogenic fuel involves gaseous hydrogen (GH2), gaseous oxygen (GO2), and/or gaseous methane (GCH4). The vehicle is a space vehicle, an airborne vehicle, a terrestrial vehicle, or a marine vehicle. In at least one embodiment, the vehicle is a fuel cell vehicle (FCV).

20 Claims, 7 Drawing Sheets

(51) Int. Cl.
  *B64G 1/50*    (2006.01)
  *F28C 3/00*    (2006.01)
  *H01L 23/34*   (2006.01)
  *H01M 8/00*    (2016.01)
  *H01M 8/04082* (2016.01)
  *H01M 8/04089* (2016.01)
  *H01M 8/0432*  (2016.01)
  *H01M 8/0438*  (2016.01)
  *H01M 8/04701* (2016.01)
  *H01M 8/04746* (2016.01)

(52) U.S. Cl.
  CPC ... *H01M 8/04708* (2013.01); *H01M 8/04753* (2013.01); *H01M 2250/20* (2013.01)

(56) References Cited

U.S. PATENT DOCUMENTS

| | | | | |
|---|---|---|---|---|
| 3,944,646 | A * | 3/1976 | Martin | B01D 53/047 423/219 |
| 5,094,409 | A * | 3/1992 | King | B64G 1/12 244/159.6 |
| 5,129,599 | A * | 7/1992 | Wollen | F17C 9/02 60/671 |
| 5,901,557 | A * | 5/1999 | Grayson | F17C 1/00 62/50.7 |
| 6,193,187 | B1 * | 2/2001 | Scott | F02K 7/10 244/171.1 |
| 6,205,803 | B1 * | 3/2001 | Scaringe | F25B 6/00 165/263 |
| 9,261,295 | B1 * | 2/2016 | Schmidt | F17C 9/00 |
| 10,627,199 | B1 * | 4/2020 | Denton | F25B 41/20 |
| 10,654,592 | B2 * | 5/2020 | Mata | H01M 8/04014 |
| 10,718,294 | B1 * | 7/2020 | Zegler | F02K 9/60 |
| 11,563,222 | B1 * | 1/2023 | Schmidt | B63G 8/001 |
| 2001/0046619 | A1 * | 11/2001 | Allen | H01M 8/2483 429/459 |
| 2004/0108148 | A1 * | 6/2004 | Vanderwees | B60L 1/003 180/65.1 |
| 2004/0265662 | A1 * | 12/2004 | Brignone | H01M 8/04186 429/440 |
| 2005/0225938 | A1 * | 10/2005 | Montgomery | H01L 23/4336 257/E23.093 |
| 2008/0087039 | A1 * | 4/2008 | Reed | B64D 11/02 62/498 |
| 2008/0087406 | A1 * | 4/2008 | Asfia | F28D 15/043 165/104.29 |
| 2008/0090124 | A1 * | 4/2008 | Barleben | H01M 8/04164 429/440 |
| 2009/0176135 | A1 * | 7/2009 | Saito | B60L 1/00 429/422 |
| 2010/0024440 | A1 * | 2/2010 | Dain | F25D 3/10 62/50.1 |
| 2010/0269487 | A1 * | 10/2010 | Grayson | B64G 1/401 60/240 |
| 2011/0048484 | A1 * | 3/2011 | Gao | H01M 8/12 136/201 |
| 2011/0053027 | A1 * | 3/2011 | Weingaertner | F28D 9/0093 429/440 |
| 2011/0281190 | A1 * | 11/2011 | Skinkle | H01M 8/04701 429/433 |
| 2012/0059364 | A1 * | 3/2012 | Baust | A61B 18/02 606/14 |
| 2012/0227374 | A1 * | 9/2012 | Zegler | B64G 1/26 244/171.1 |
| 2013/0086994 | A1 * | 4/2013 | Noui-Mehidi | G01F 1/3218 73/861.22 |
| 2014/0123916 | A1 * | 5/2014 | Coldren | F02B 43/10 123/3 |
| 2015/0017557 | A1 * | 1/2015 | Hoffjann | A62C 3/08 429/410 |
| 2015/0330575 | A1 * | 11/2015 | Epstein | F17C 9/02 62/48.1 |
| 2016/0025339 | A1 * | 1/2016 | Kamath | F02C 3/22 60/39.12 |
| 2017/0233111 | A1 * | 8/2017 | Mata | H01M 8/2483 429/459 |
| 2017/0256804 | A1 * | 9/2017 | Miller | H01M 8/04029 |
| 2018/0112629 | A1 * | 4/2018 | Popadiuc | F02M 21/0215 |
| 2019/0195547 | A1 * | 6/2019 | Moon | F17C 9/00 |
| 2019/0278344 | A1 * | 9/2019 | Chang | F25B 41/20 |
| 2019/0359355 | A1 * | 11/2019 | Blumer | H01M 8/00 |

OTHER PUBLICATIONS www.merriam-webster.com/dictionary/solenoid (Year: 2020).*
Wikipedia: Solenoid Valve, en.wikipedia.org/wiki/Solenoid_valve, 2016 (Year: 2021).*
Merriam Webster: SOlenoid Valve, https://www.merriam-webster.com/dictionary/solenoid, 2016 (Year: 2021).*
Ready-for-Sea Handbook, United States Naval Reserve Intelligence Program, Typical Ship Organization, https://irp.fas.org/doddir/navy/rfs/part04.htm, 2022 (Year: 2022).*
Valcor Engineering—Latch Valves for Missiles & Space, https://www.valcor.com/aircraft/aircraft-latch-valves/, 2022 (Year: 2022).*

* cited by examiner

ADVANCED COOLING FOR CRYOGENIC POWERED VEHICLES

GOVERNMENT LICENSE RIGHTS

The invention described herein was made in the performance of work under NASA Contract No. SLS NNM07AB03C, and is subject to the provisions of Section 305 of the National Aeronautics and Space Act of 1958 (72 Stat. 435: 42 U.S.C. 2457).

FIELD

The present disclosure relates to cryogenic powered vehicles. In particular, it relates to advanced cooling for cryogenic powered vehicles.

BACKGROUND

In most vehicles with cryogenic fuel, such as launch vehicles, a portion of the fuel escapes in boil-off (in a gaseous form) and is purged overboard away from the vehicle. At the same time, electronics and/or other subsystems (e.g., avionics) on the vehicle often require cooling methods that add weight to the vehicle and sometimes require additional power from the vehicle. Currently, for example, conventional spacecraft and space platforms (e.g., launch vehicles) typically utilize cooling methods that employ large radiators, which add considerable mass to the vehicle. Often, the large radiators are utilized with active cooling systems with pumps, which further add mass and cost, along with reducing reliability.

There is, therefore, a need for an improved technology for cooling cryogenic powered vehicles.

SUMMARY

The present disclosure relates to a method, system, and apparatus for advanced cooling for cryogenic powered vehicles. In one or more embodiments, a method for cooling a vehicle comprises routing, by a bypass line, boil-off of a cryogenic fuel of the vehicle past a cold plate to cool a subsystem mounted proximate the cold plate. The method further comprises purging the boil-off in a direction away from the vehicle, after the boil-off passes the cold plate.

In one or more embodiments, the cryogenic fuel comprises liquid hydrogen ($LH_2$), liquid oxygen ($LO_2$), and/or liquid methane ($LCH_4$). In at least one embodiment, the boil-off of the cryogenic fuel comprises gaseous hydrogen ($GH_2$), gaseous oxygen ($GO_2$), and/or gaseous methane ($GCH_4$).

In at least one embodiment, the method further comprises opening a regulator valve on the bypass line to direct the boil-off towards the bypass line. In one or more embodiments, the method further comprises sensing, by a regulator valve on the bypass line, a pressure of the bypass line. In some embodiments, the method further comprises at least one of opening or closing the regulator valve on the bypass line to maintain the pressure of the bypass line to be within a predetermined pressure range.

In one or more embodiments, the method further comprises sensing, by a temperature sensor associated with the cold plate, a temperature of the cold plate. In some embodiments, the method further comprises at least one of opening and closing a control valve on the bypass line to maintain the temperature of the cold plate to be within a predetermined temperature range.

In at least one embodiment, the vehicle is a space vehicle, an airborne vehicle, a terrestrial vehicle, or a marine vehicle. In some embodiments, the vehicle is a fuel cell vehicle (FCV).

In one or more embodiments, the method further comprises opening a solenoid valve on the bypass line to direct the boil-off towards the bypass line. In one or more embodiments, the method further comprises adjusting, by an orifice plate on the bypass line, a rate of a flow of the boil-off within the bypass line.

In at least one embodiment, the purging of the boil-off in the direction away from the vehicle is via the bypass line or a main vent line.

In at least one embodiment, the method further comprises causing, by a check valve on the bypass line, the boil-off to flow within the bypass line in a forward direction.

In one or more embodiments, a system for cooling a vehicle comprises a cold plate, where a subsystem of the vehicle is mounted proximate the cold plate. The system further comprises a bypass line to route boil-off of a cryogenic fuel of the vehicle past the cold plate to cool the subsystem mounted proximate the cold plate. In one or more embodiments, after the boil-off passes the cold plate, the boil-off is purged in a direction away from the vehicle.

In at least one embodiment, the system further comprises a regulator valve on the bypass line to direct the boil-off towards the bypass line.

In one or more embodiments, the system further comprises a regulator valve on the bypass line to sense a pressure of the bypass line. In some embodiments, the regulator valve on the bypass line is further configured to open or close to maintain the pressure of the bypass line to be within a predetermined pressure range.

In at least one embodiment, the system further comprises a temperature sensor associated with the cold plate to sense a temperature of the cold plate. In some embodiments, the system further comprises a control valve on the bypass line to open or close to maintain the temperature of the cold plate to be within a predetermined temperature range.

In one or more embodiments, the system further comprises a solenoid valve on the bypass line to open to direct the boil-off towards the bypass line.

In at least one embodiment, the system further comprises an orifice plate on the bypass line to adjust a rate of a flow of the boil-off within the bypass line.

In one or more embodiments, the system further comprises a check valve on the bypass line to cause the boil-off to flow within the bypass line in a forward direction.

The features, functions, and advantages can be achieved independently in various embodiments of the present disclosure or may be combined in yet other embodiments.

DRAWINGS

These and other features, aspects, and advantages of the present disclosure will become better understood with regard to the following description, appended claims, and accompanying drawings where:

DESCRIPTION

Figure 1:
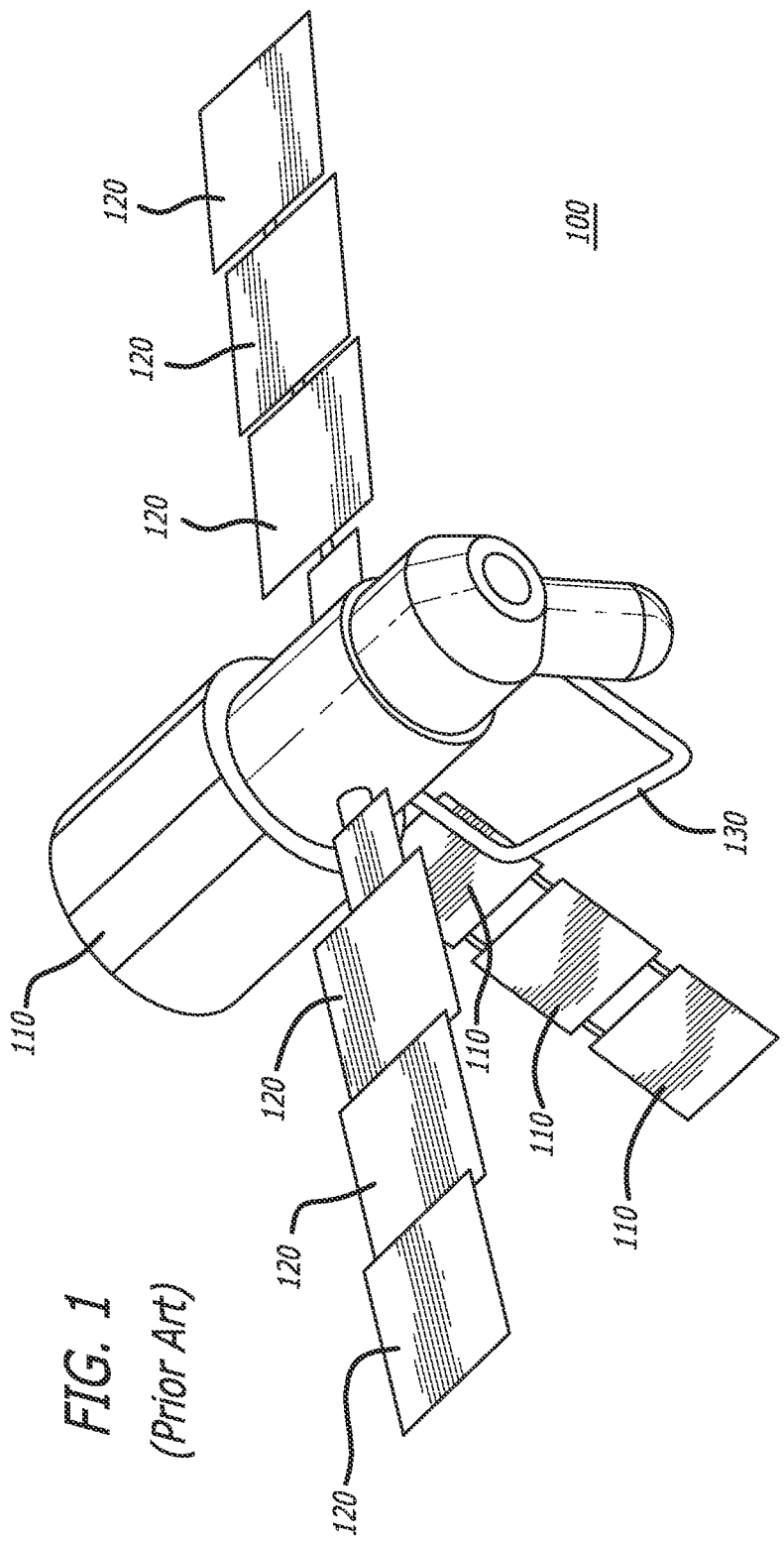
FIG. 1 is a diagram showing an exemplary satellite that employs a conventional cooling system for the satellite.

The methods and apparatus disclosed herein provide an operative system for advanced cooling for cryogenic powered vehicles. In one or more embodiments, the system of the present disclosure provides cooling to subsystems on the cryogenic powered vehicle by routing the cold boil-off of the cryogenic fuel past the subsystems for cooling.

As previously mentioned above, in most vehicles with cryogenic fuel, such as launch vehicles, a portion of the fuel escapes in boil-off (in a gaseous form) and is purged overboard away from the vehicle. At the same time, electronics and/or other subsystems (e.g., avionics) on the vehicle often require cooling methods that add weight to the vehicle and sometimes require additional power from the vehicle. Currently, for example, conventional spacecraft and space platforms (e.g., launch vehicles) typically utilize cooling methods that employ large radiators, which add considerable mass to the vehicle. Often, the large radiators are utilized with active cooling systems with pumps, which further add mass and cost, along with reducing reliability.

The present disclosure teaches a system and method that provides significant cooling to other subsystems on the vehicle by repurposing cryogenic fuel boil-off. It should be noted that the fuel boil-off, although referred to as "boil-off", actually has a cold temperature of much less than –100 degrees Fahrenheit (–100° F.). The disclosed system significantly reduces mass, and possibly power and complexity, while maintaining or improving the cooling capacity for electronics and other subsystems. Additionally, the disclosed system has the advantage of having a cooling capacity similar to that of an active cooling system, while having the reduced mass of a passive cooling system.

In the following description, numerous details are set forth in order to provide a more thorough description of the system. It will be apparent, however, to one skilled in the art, that the disclosed system may be practiced without these specific details. In the other instances, well known features have not been described in detail, so as not to unnecessarily obscure the system.

Embodiments of the present disclosure may be described herein in terms of functional and/or logical components and various processing steps. It should be appreciated that such components may be realized by any number of hardware, software, and/or firmware components configured to perform the specified functions. For example, an embodiment of the present disclosure may employ various integrated circuit components (e.g., memory elements, digital signal processing elements, logic elements, look-up tables, or the like), which may carry out a variety of functions under the control of one or more processors, microprocessors, or other control devices. In addition, those skilled in the art will appreciate that embodiments of the present disclosure may be practiced in conjunction with other components, and that the systems described herein are merely example embodiments of the present disclosure.

For the sake of brevity, conventional techniques and components related to cryogenic powered vehicles, and other functional aspects of the system (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in one or more embodiments of the present disclosure.

FIG. 1 is a diagram showing an exemplary satellite 100 that employs a conventional cooling system for the satellite (e.g., the vehicle) 100. In this figure, the satellite 100 includes a plurality of radiators 110, a plurality of solar panels 120, and a robotic arm 130. The plurality of radiators 110 are used to cool electronics (not shown) and/or subsystems (e.g., avionics) (not shown). The electronics and/or subsystems are mounted adjacent to the radiators 110 and/or on the radiators 110 themselves. The radiators 110 are mounted to the exterior of the satellite 100 to maximize deep space exposure. In addition, typically, a cooling loop is employed to transport waste heat from the electronics and/or subsystems to the radiators.

Figure 2:
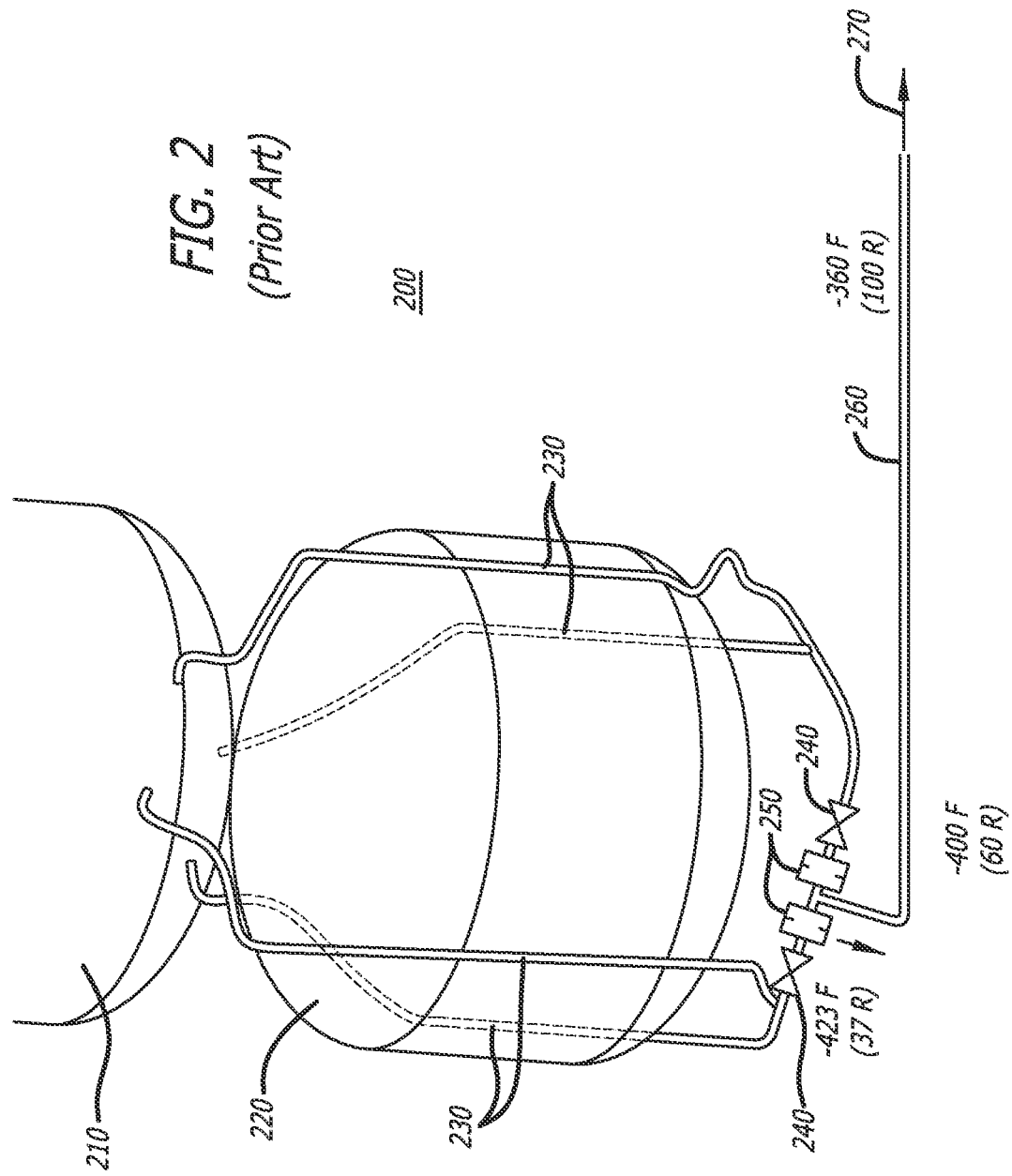
FIG. 2 is a diagram showing a conventional system for purging boil-off from a cryogenic fuel of a launch vehicle.

FIG. 2 is a diagram showing a conventional system 200 for purging boil-off from a cryogenic fuel of a launch vehicle. In this figure, two cryogenic propellant tanks 210, 220 of the launch vehicle are shown. Each of the cryogenic propellant tanks 210, 220 stores a cryogenic fuel for the launch vehicle. Various different types of cryogenic fuels may be employed by the launch vehicle including, but not limited to, liquid hydrogen ($LH_2$), liquid oxygen ($LO_2$), and/or liquid methane ($LCH_4$). For example, one cryogenic propellant tank 210 may store liquid hydrogen ($LH_2$) or liquid oxygen ($LO_2$), and the other cryogenic propellant tank 220 may store liquid oxygen ($LO_2$) or liquid hydrogen ($LH_2$).

During operation of the conventional system 200, boil-off (which is in the form of, for example, gaseous hydrogen ($GH_2$), gaseous oxygen ($GO_2$), and/or gaseous methane ($GCH_4$)) from the cryogenic propellant tank 210, is carried away from the cryogenic propellant tank 210 via vent pipes 230. The boil-off then passes through solenoid valves 240 and orifice plates 250 to a main vent line 260.

The solenoid valves 240 are electromechanically operated valves that are controlled by an electric current through a solenoid within the valve to switch the flow of the boil-off through the solenoid valve 240 "on" (i.e., allowing the boil-off to pass through the solenoid valve 240) or "off" (i.e., not allowing the boil-off to pass through the solenoid valve 240). As such, during operation, the solenoid valves 240 are switched "on" to allow the boil-off to pass through themselves towards the main vent line 260.

The orifice plates 250 are utilized to measure the flow rate of the boil-off as the boil-off passes through the orifice plates 250 and/or to adjust (e.g., reduce) a rate of flow of the boil-off as the boil-off passes through the orifice plates 250.

Then, after the boil-off reaches the main vent line 260, the boil-off passes through the main vent line 260, and is purged via the main vent line 260 in a direction 270 away from the launch vehicle.

It should be noted that, in FIG. 2, exemplary temperatures for several different locations of the system are noted. For example, for the region of the solenoid valves 240, the figure notes that the temperature is −423 degrees)(° Fahrenheit (.F) (37° Rankin (R)) Also, at the beginning of the main vent line 260, the figure notes that the temperature has increased to −400° F. (60° R). And, towards the end of the main vent line 260, the figure notes that the temperature has increased to −360° F. (100° R).

Figure 3:
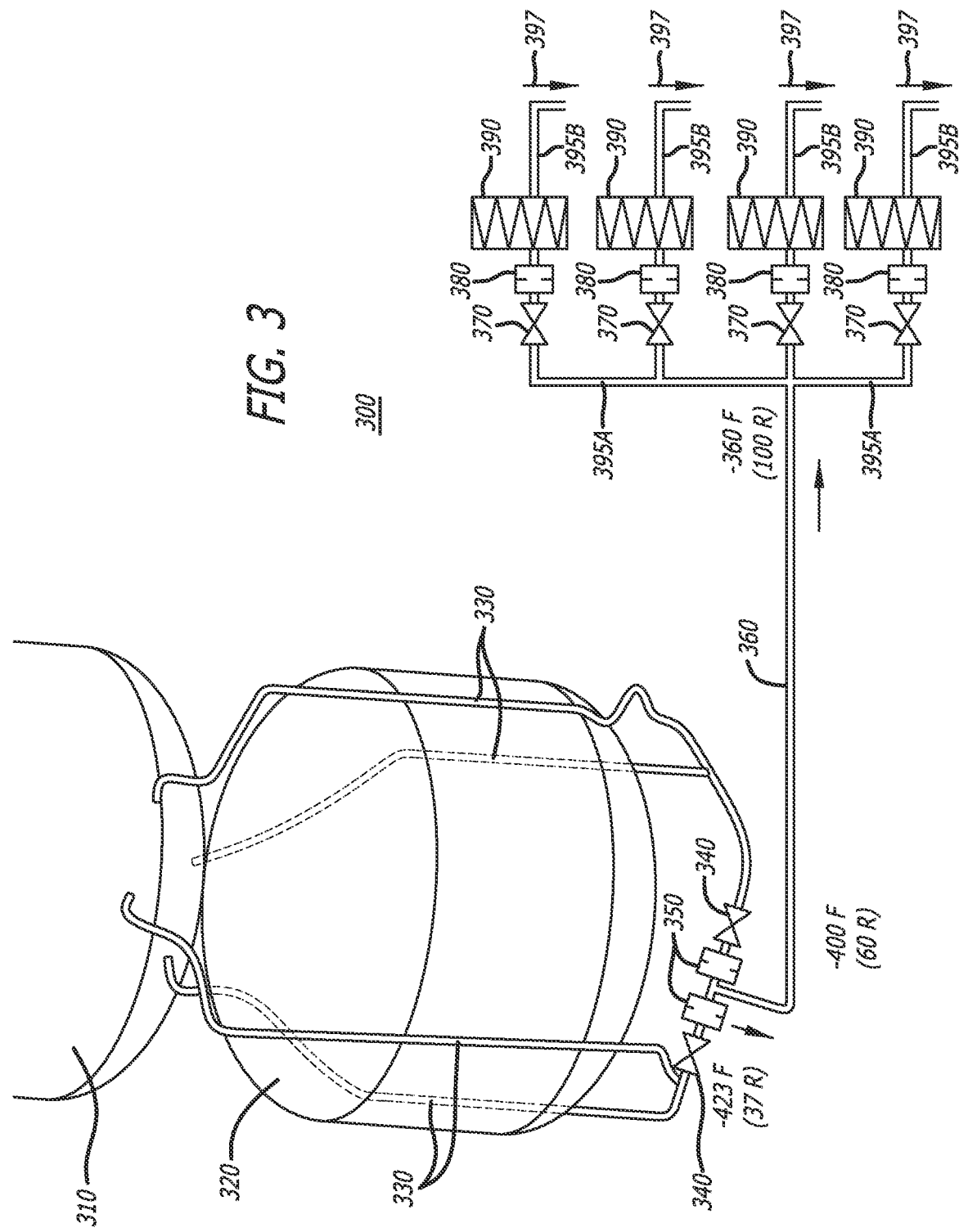
FIG. 3 is a diagram showing an example of a system for advanced cooling for cryogenic powered vehicles that employs solenoid valves and orifice plates, in accordance with at least one embodiment of the present disclosure.

FIG. 3 is a diagram showing an example of a system 300 for advanced cooling for cryogenic powered vehicles that employs solenoid valves 370 and orifice plates 380, in accordance with at least one embodiment of the present disclosure. In this figure, two cryogenic propellant tanks 310, 320 of the vehicle (e.g., a launch vehicle) are shown. It should be noted that, for the exemplary embodiment depicted in FIG. 3, the vehicle of the disclosed system 300 is a launch vehicle (not shown). However, in other embodiments, various different types of cryogenic powered vehicles may be employed for the vehicle of the disclosed system 300 including, but not limited to, a space vehicle (e.g., a satellite or launch vehicle), an airborne vehicle (e.g., a cryogenic powered aircraft), a terrestrial vehicle (e.g., a cryogenic powered car, such as a fuel cell vehicle (FCV)), and a marine vehicle (e.g., a cryogenic powered ship).

Each of the cryogenic propellant tanks 310, 320 in FIG. 3 stores a cryogenic fuel for the launch vehicle. Various different types of cryogenic fuels may be employed by the launch vehicle including, but not limited to, liquid hydrogen ($LH_2$), liquid oxygen ($LO_2$), and/or liquid methane ($LCH_4$). For example, one cryogenic propellant tank 310 may store liquid hydrogen ($LH_2$) or liquid oxygen ($LO_2$), and the other cryogenic propellant tank 320 may store liquid oxygen ($LO_2$) or liquid hydrogen ($LH_2$).

During operation of the disclosed system 300, boil-off (which may be in the form of, for example, gaseous hydrogen ($GH_2$), gaseous oxygen ($GO_2$), and/or gaseous methane ($GCH_4$)) from the cryogenic propellant tank 310, is carried away from the cryogenic propellant tank 310 via vent pipes 330. The boil-off then passes through solenoid valves 340 and orifice plates 350 to a main vent line 360. It should be noted that, in one or more embodiments, the disclosed system 300 may comprise more or less vent pipes 330 than the four vent pipes 330 shown in FIG. 3.

The solenoid valves 340 are electromechanically operated valves that are controlled by an electric current through a solenoid within the valve to switch the flow of the boil-off through the solenoid valve 340 "on" (i.e., allowing the boil-off to pass through the solenoid valve 340) or "off" (i.e., not allowing the boil-off to pass through the solenoid valve 340). As such, during operation, the solenoid valves 340 are switched "on" to allow the boil-off to pass through themselves towards the main vent line 360.

The orifice plates 350 are utilized to measure the flow rate of the boil-off as the boil-off passes through the orifice plates 350 and/or to adjust (e.g., restrict) a rate of the flow of the boil-off as the boil-off passes through the orifice plates 350.

Then, after the boil-off reaches the main vent line 360, the boil-off passes through the main vent line 360 to a plurality of solenoid valves 370 on bypass lines 395A. It should be noted that the bypass lines 395 comprise a first portion of bypass lines that is located upstream from solenoid valves 370, where this first portion of bypass lines is referred to as bypass lines 395A; and a second portion of bypass lines that is located downstream from solenoid valves 370, where this second portion of the bypass lines is referred to as bypass lines 395B.

The boil-off then passes through the solenoid valves 370 on the bypass lines 395A to direct the boil-off towards the bypass lines 395B. The solenoid valves 370 are electromechanically operated valves that are controlled by an electric current through a solenoid within the valve to switch the flow of the boil-off through the solenoid valve 370 "on" (i.e., allowing the boil-off to pass through the solenoid valve 370) or "off" (i.e., not allowing the boil-off to pass through the solenoid valve 370). During operation, the solenoid valves 370 are switched "on" to allow the boil-off to pass through themselves towards the bypass lines 395B. It should be noted that, in one or more embodiments, the disclosed system 300 may comprise more or less bypass lines 395A, 395B than the number of bypass lines 395A, 395B shown in FIG. 3.

The boil-off then passes through orifice plates 380 on the bypass lines 395B. The orifice plates 380 are utilized to measure the flow rate of the boil-off as the boil-off passes through the orifice plates 380 and/or to adjust (e.g., reduce) a rate of the flow of the boil-off as the boil-off passes through the orifice plates 380.

Figure 7:
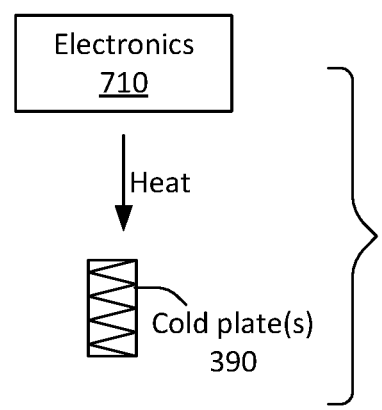
FIG. 7 is a diagram showing an example system for advanced cooling of electronics for cryogenic powered vehicles that employs a cold plate.

After the boil-off passes through the orifice plates 380, the boil-off passes through a portion of the bypass lines 395B that is proximate (e.g., mounted on or mounted adjacent to) the cold plates 390. Electronics (e.g., electronic components) and/or subsystems (e.g., avionics) 710 (FIG. 7) to be cooled by the boil-off are mounted proximate (e.g., mounted on or mounted adjacent to (e.g., wherein "adjacent to" means mounted within a few inches)) the cold plates 390. As the boil-off passes through the portion of the bypass lines 395B that is proximate the cold plates 390, the electronics (e.g., electronic components) and/or subsystems (e.g., avionics) 710 mounted proximate the cold plates 390 are cooled by the boil-off. It should be noted that, in one or more embodiments, the disclosed system 300 may comprise more or less cold plates 390 than the four cold plates 390 shown in FIG. 3.

After the boil-off passes through the portion of the bypass lines 395B that is proximate the cold plates 390, the boil-off is purged via the bypass lines 395B in a direction 397 away from the launch vehicle.

It should be noted that, in FIG. 3, exemplary temperatures for several different locations of the system are shown. For example, for the region of the solenoid valves 340, the figure notes that the temperature is −423 degrees)(° Fahrenheit (F.) (37° Rankin (R)). Also, at the beginning of the main vent line 360, the figure notes that the temperature has increased to −400° F. (60° R). And, towards the end of the main vent line 360 and the beginning of the plurality of bypass lines 395A, the figure notes that the temperature has increased to −360° F. (100° R).

Figure 4:
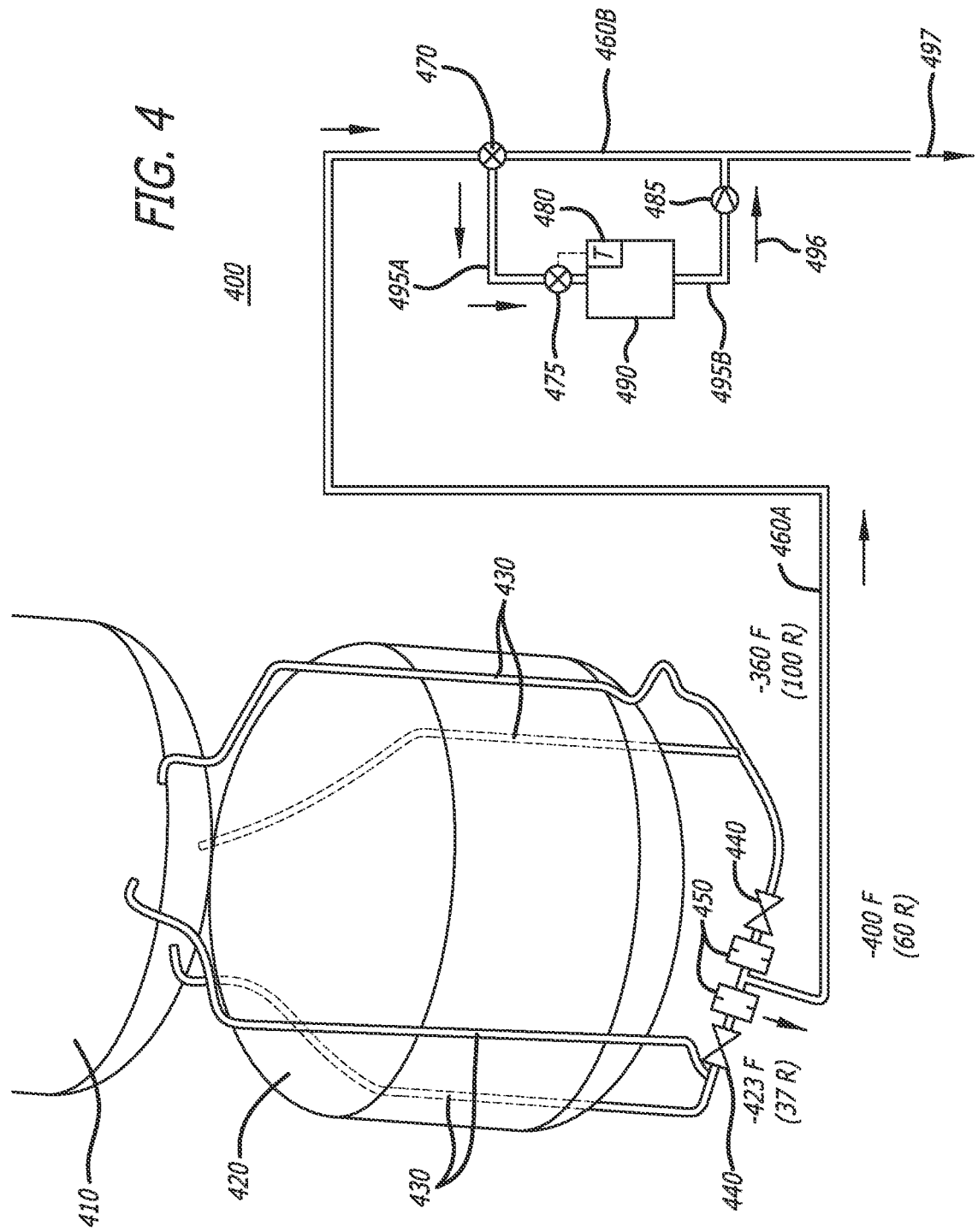
FIG. 4 is a diagram showing an example system for advanced cooling for cryogenic powered vehicles that employs a regulator valve and a temperature sensor, in accordance with at least one embodiment of the present disclosure.

FIG. 4 is a diagram showing an example of the disclosed system 400 for advanced cooling for cryogenic powered vehicles that employs a regulator valve 470 and a temperature sensor 480, in accordance with at least one embodiment of the present disclosure. In this figure, two cryogenic propellant tanks 410, 420 of the vehicle (e.g., a launch vehicle) are shown. It should be noted that, for the exemplary embodiment depicted in FIG. 4, the vehicle of the disclosed system 400 is a launch vehicle (not shown). However, in other embodiments, various different types of cryogenic powered vehicles may be employed for the vehicle of the disclosed system 400 including, but not limited to, a space vehicle (e.g., a satellite or launch vehicle), an airborne vehicle (e.g., a cryogenic powered aircraft), a terrestrial vehicle (e.g., a cryogenic powered car, such as a fuel cell vehicle (FCV)), and a marine vehicle (e.g., a cryogenic powered ship).

Each of the cryogenic propellant tanks 410, 420 in FIG. 4 stores a cryogenic fuel for the launch vehicle. Various different types of cryogenic fuels may be employed by the launch vehicle including, but not limited to, liquid hydrogen ($LH_2$), liquid oxygen ($LO_2$), and/or liquid methane ($LCH_4$). For example, one cryogenic propellant tank 410 may store liquid hydrogen ($LH_2$) or liquid oxygen ($LO_2$), and the other cryogenic propellant tank 420 may store liquid oxygen ($LO_2$) or liquid hydrogen ($LH_2$).

During operation of the disclosed system 400, boil-off (which is in the form of, for example, gaseous hydrogen ($GH_2$), gaseous oxygen ($GO_2$), and/or gaseous methane ($GCH_4$)) from the cryogenic propellant tank 410, is carried away from the cryogenic propellant tank 410 via vent pipes 430. The boil-off then passes through solenoid valves 440 and orifice plates 450 to a main vent line 460A. It should be noted that the main vent line 460A and 460B comprises a first portion of the main vent line that is located upstream from regulator valve 470, where this first portion of the main vent line is referred to as main vent line 460A; and a second portion of the main vent line that is located downstream from regulator valve 470, where this second portion of the main vent line is referred to as main vent line 460B. In addition, it should be noted that, in one or more embodiments, the disclosed system 400 may comprise more or less vent pipes 430 than the four vent pipes 430 shown in FIG. 4.

The solenoid valves 440 are electromechanically operated valves that are controlled by an electric current through a solenoid within the valve to switch the flow of the boil-off through the solenoid valve 440 "on" (i.e., allowing the boil-off to pass through the solenoid valve 440) or "off" (i.e., not allowing the boil-off to pass through the solenoid valve 440). As such, during operation, the solenoid valves 440 are switched "on" to allow the boil-off to pass through themselves towards the main vent line 460A.

The orifice plates 450 are utilized to measure the flow rate of the boil-off as the boil-off passes through the orifice plates 450 and/or to adjust (e.g., reduce) a rate of the flow of the boil-off as the boil-off passes through the orifice plates 450.

Then, after the boil-off reaches the main vent line 460A, the boil-off passes through the main vent line 460A to a regulator valve 470 on bypass line 495A. It should be noted that the bypass lines 495A and 495B comprise a first portion of bypass lines that is located upstream from control valve 475, where this first portion of bypass lines is referred to as bypass lines 495A; and a second portion of bypass lines that is located downstream from control valve 475, where this second portion of the bypass lines is referred to as bypass lines 495B. It should be noted that, in one or more embodiments, the disclosed system 400 may comprise more bypass lines 495A, 495B than shown in FIG. 4.

The regulator valve 470 senses the pressure on the bypass line 495A. The regulator valve 470 will open (i.e., to allow boil-off to pass through from the main vent line 460A to the bypass line 495A) and/or close (i.e., to not allow boil-off to pass through from the main vent line 460A to the bypass line 495A) in order to maintain the pressure on the bypass line 495A to be within a predetermined pressure range (e.g., 20 to 35 pound-force per square inch (psi)). During operation, when the regulator valve 470 is open, the boil-off is directed towards (and through) the bypass line 495A. However, when the regulator valve 470 is closed, the boil-off is directed towards (and through) the main vent line 460B in a direction 497 away from the launch vehicle.

A cold plate 490 is mounted proximate (e.g., mounted on or mounted adjacent to) at least a portion of the bypass line 495B. It should be noted that, in one or more embodiments, the disclosed system 400 may comprise more than one cold plate 490 as is shown in this figure.

The temperature sensor 480 mounted proximate (e.g., mounted on or mounted adjacent) the cold plate 490 senses a temperature of the cold plate 490. Electronics (e.g., electronic components) and/or subsystems (e.g., avionics) to be cooled by the boil-off are mounted proximate (e.g., mounted on or mounted adjacent to (e.g., wherein "adjacent to" means mounted within a few inches)) the cold plate 490. As such, the temperature that the temperature sensor 480 senses is approximately the temperature of the electronics (e.g., electronic components) and/or subsystems (e.g., avionics).

After the boil-off passes through the regulator valve 470, control valve 475 on the bypass line 495A will open (i.e., to allow boil-off to pass through the portion of the bypass line 495B proximate the cold plate 490) and/or close (i.e., to not allow boil-off to pass through the portion of the bypass line 495B proximate the cold plate 490) in order to maintain the temperature (which is sensed by the temperature sensor 480) of the cold plate 490 to be within a predetermined temperature range (e.g., 50° to 70° F.). The predetermined temperature range is selected to ensure efficient performance and life span of the electronics (e.g., electronic components) and/or subsystems (e.g., avionics) mounted proximate the cold plate 490.

Then, after the boil-off passes through the portion of the bypass line 495B proximate the cold plate 490, a check valve 485 (which is a unidirectional flow valve) on the bypass line 495B causes the boil-off to flow within the bypass line 495B in a forward direction 496 only (i.e., the check valve 485 will not allow the boil-off to flow in a backwards direction, which is in an opposite direction to that denoted by arrow 496). After the boil-off passes through the check valve 485 on the bypass line 495B, the boil-off is purged via the main vent line 460B in a direction 497 away from the launch vehicle.

In FIG. 4, exemplary temperatures for several different locations of the system are noted. For example, for the region of the solenoid valves 440, the figure notes that the temperature is −423° F. (37° Rankin (R)). Also, at the beginning of the main vent line 460A, the figure notes that the temperature has increased to −400° F. (60° R). And, towards the end of the main vent line 460A, the figure notes that the temperature has increased to −360° F. (100° R).

Figure 5:
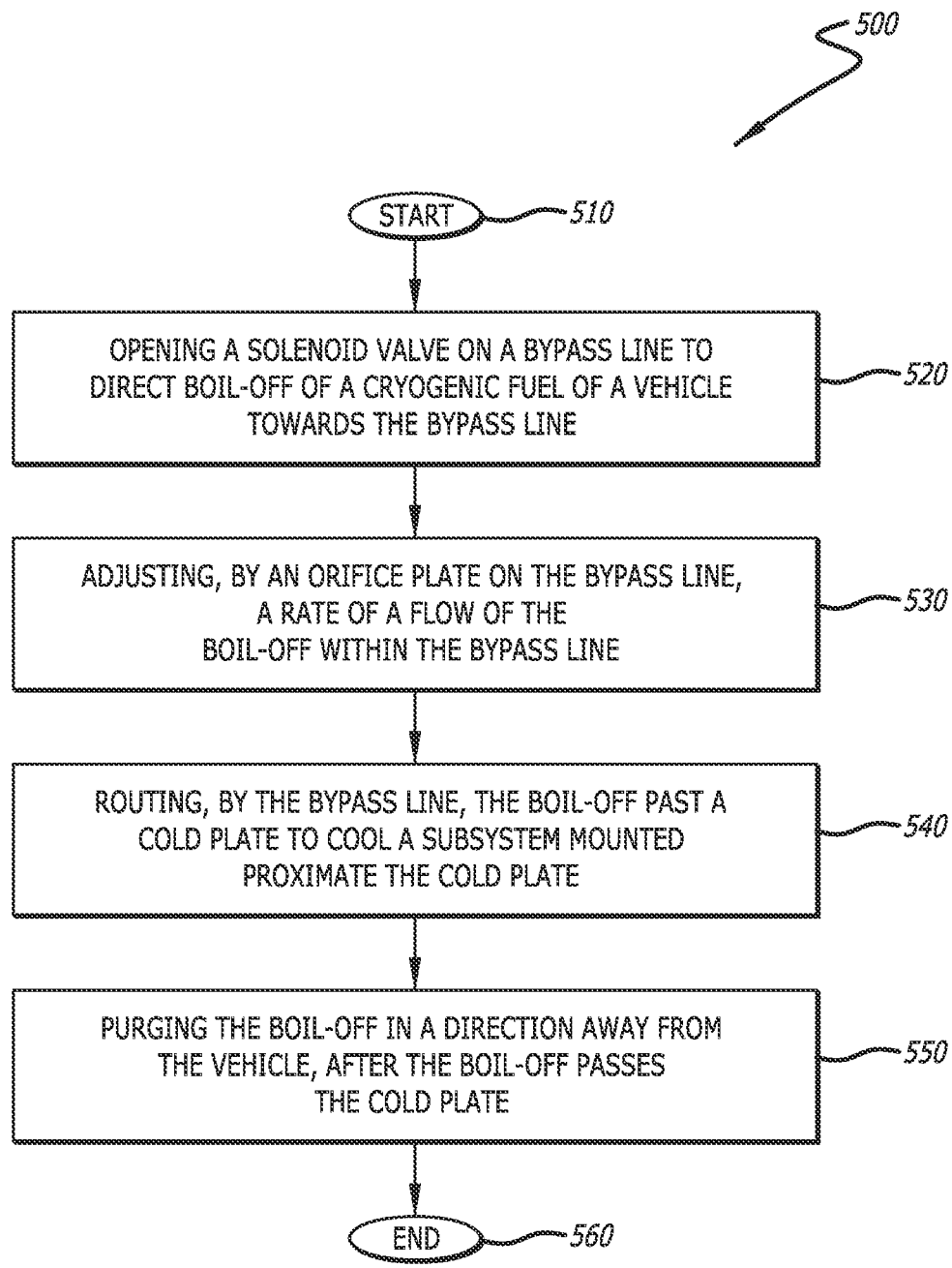
FIG. 5 is a flow chart showing an example method for advanced cooling for cryogenic powered vehicles for the system of FIG. 3, in accordance with at least one embodiment of the present disclosure.

FIG. 5 is a flow chart showing an example method 500 for advanced cooling for cryogenic powered vehicles for the system of FIG. 3, in accordance with at least one embodiment of the present disclosure. At the start 510 of the method 500, a solenoid valve on a bypass line is opened to direct boil-off of a cryogenic fuel of a vehicle towards the bypass line 520. Then, an orifice plate on the bypass line adjusts a rate of a flow of the boil-off within the bypass line 530. The bypass line then routes the boil-off past a cold plate to cool a subsystem mounted proximate the cold plate 540. Then, the boil-off is purged in a direction away from the vehicle, after the boil-off passes the cold plate 550. Then, the method 500 ends 560.

Figure 6:
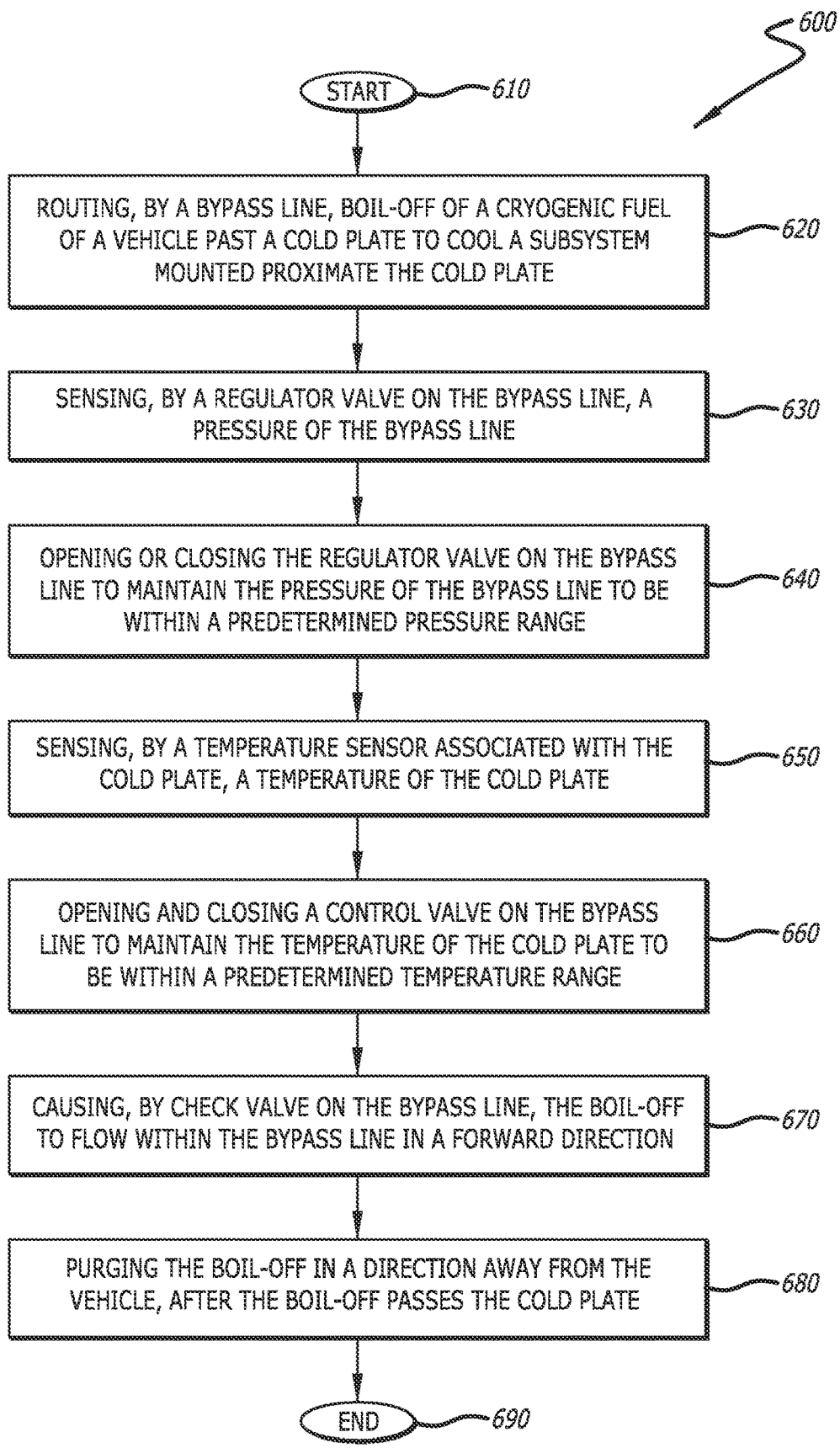
FIG. 6 is a flow chart showing an example method for advanced cooling for cryogenic powered vehicles for the system of FIG. 4, in accordance with at least one embodiment of the present disclosure.

FIG. 6 is a flow chart showing an example method 600 for advanced cooling for cryogenic powered vehicles for the system of FIG. 4, in accordance with at least one embodiment of the present disclosure. At the start 610 of the method

600, a bypass line routes boil-off of a cryogenic fuel of a vehicle past a cold plate to cool a subsystem mounted proximate the cold plate 620. Then, a regulator valve on the bypass line senses a pressure of the bypass line 630. The regulator valve is then opened or closed to maintain the pressure of the bypass line to be within a predetermined pressure range 640. A temperature sensor associated with the cold plate senses the temperature of the cold plate 650. Then, a control valve is opened or closed on the bypass line to maintain the temperature of the cold plate to be within a predetermined temperature range 660. A check valve on the bypass line causes the boil-off to flow within the bypass line in a forward direction 670. Then, the boil-off is purged in a direction away from the vehicle, after the boil-off passes the cold plate 680. Then, the method 600 ends 690.

Although particular embodiments have been shown and described, it should be understood that the above discussion is not intended to limit the scope of these embodiments. While embodiments and variations of the many aspects of the invention have been disclosed and described herein, such disclosure is provided for purposes of explanation and illustration only. Thus, various changes and modifications may be made without departing from the scope of the claims.

Where methods described above indicate certain events occurring in certain order, those of ordinary skill in the art having the benefit of this disclosure would recognize that the ordering may be modified and that such modifications are in accordance with the variations of the present disclosure. Additionally, parts of methods may be performed concurrently in a parallel process when possible, as well as performed sequentially. In addition, more steps or less steps of the methods may be performed.

Accordingly, embodiments are intended to exemplify alternatives, modifications, and equivalents that may fall within the scope of the claims.

Although certain illustrative embodiments and methods have been disclosed herein, it can be apparent from the foregoing disclosure to those skilled in the art that variations and modifications of such embodiments and methods can be made without departing from the true spirit and scope of this disclosure. Many other examples exist, each differing from others in matters of detail only. Accordingly, it is intended that this disclosure be limited only to the extent required by the appended claims and the rules and principles of applicable law.

We claim:

1. A method for cooling a cryogenic powered vehicle, the method comprising:
    storing a cryogenic fuel in a cryogenic fuel tank;
    capturing boil-off of the cryogenic fuel escaped from the cryogenic fuel tank and forming escaped boil-off; and
    providing cooling to an avionics subsystem by repurposing the escaped boil-off;
    wherein repurposing the escaped boil-off comprises:
        routing, by a bypass line, the escaped boil-off past a cold plate to cool the avionics subsystem mounted on the cold plate; and
        purging the escaped boil-off in a direction away from the vehicle, after the escaped boil-off passes the cold plate;
    wherein the method further comprises:
        sensing, by a temperature sensor associated with the cold plate, a temperature of the cold plate; and
        at least one of opening or closing a control valve on the bypass line to maintain the temperature of the cold plate to be within a predetermined temperature range.

2. The method of claim 1, wherein:
    the cryogenic fuel comprises at least one of liquid hydrogen ($LH_2$), liquid oxygen ($LO_2$), or liquid methane ($LCH_4$).

3. The method of claim 1, wherein:
    the escaped boil-off of the cryogenic fuel comprises at least one of gaseous hydrogen ($GH_2$), gaseous oxygen ($GO_2$), or gaseous methane ($GCH_4$); and
    the escaped boil-off enters the bypass line after escaping from the cryogenic fuel tank via a vent pipe.

4. The method of claim 1, wherein the method further comprises:
    opening a regulator valve on the bypass line to direct the escaped boil-off toward the bypass line.

5. The method of claim 1, wherein the method further comprises:
    sensing, by a regulator valve on the bypass line, a pressure of the bypass line.

6. The method of claim 5, wherein the method further comprises:
    at least one of opening or closing the regulator valve on the bypass line to maintain the pressure of the bypass line to be within a predetermined pressure range.

7. The method of claim 1, wherein:
    the vehicle is one of a space vehicle, an airborne vehicle, a terrestrial vehicle, or a marine vehicle.

8. The method of claim 1, wherein the vehicle is a fuel cell vehicle (FCV).

9. The method of claim 1, wherein the method further comprises:
    opening a solenoid valve on the bypass line to direct the escaped boil-off toward the bypass line.

10. The method of claim 1, wherein the method further comprises:
    adjusting, by an orifice plate on the bypass line, a rate of a flow of the escaped boil-off within the bypass line.

11. The method of claim 1, wherein the purging of the escaped boil-off in the direction away from the vehicle comprises purging of the escaped boil-off in the direction away from the vehicle via a main vent line.

12. The method of claim 1, wherein the method further comprises:
    causing, by a check valve on the bypass line, the escaped boil-off to flow within the bypass line in a forward direction.

13. A system for cooling a cryogenic powered vehicle, the system comprising:
    an avionics subsystem;
    a cryogenic fuel tank for storing a cryogenic fuel, the cryogenic fuel tank allowing a boil-off of cryogenic fuel to escape and form escaped boil-off; and
    a repurposing subsystem for repurposing the escaped boil-off to cool the avionics subsystem, the repurposing subsystem comprising;
    a cold plate, wherein the avionics subsystem is mounted on the cold plate; and
    a bypass line configured to route the escaped boil-off past the cold plate to cool the avionics subsystem mounted on the cold plate;
    a temperature sensor associated with the cold plate and configured to sense a temperature of the cold plate; and a control valve on the bypass line configured to at least one of open or close to maintain the temperature of the cold plate to be within a predetermined temperature range.

14. The system of claim 13, further comprising:
one or more vent pipes configured to route the escaped boil-off to flow from the cryogenic fuel tank to the bypass line; and
a regulator valve configured to sense a pressure of at least of the one or more bypass lines.

15. The system of claim 14, wherein the regulator valve is further configured to at least one of open or close to maintain the pressure to be within a predetermined pressure range.

16. The system of claim 13, wherein the system is further configured such that:
the escaped boil-off is purged in the direction away from the vehicle via a main vent line.

17. The system of claim 13, wherein the system further comprises:
a solenoid valve on the bypass line configured to open to direct the escaped boil-off toward the bypass line.

18. The system of claim 13, wherein the system is configured such that after the escaped boil-off passes the cold plate, the escaped boil-off is purged in a direction away from the vehicle.

19. The system of claim 13, wherein the system is configured such that the escaped boil-off enters the bypass line after escaping from the cryogenic fuel tank via a vent pipe.

20. The system of claim 13, wherein:
the vehicle is one of a space vehicle, an airborne vehicle, a terrestrial vehicle, or a marine vehicle.

* * * * *